United States Patent
Molchanov

(10) Patent No.: US 11,598,020 B2
(45) Date of Patent: Mar. 7, 2023

(54) DEVICE FOR PULLING A SINGLE CRYSTAL OF SEMICONDUCTOR MATERIAL OUT OF A MELT USING THE CZ METHOD, AND METHOD USING THE DEVICE

(71) Applicant: Siltronic AG, Munich (DE)

(72) Inventor: Alexander Molchanov, Marktl (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 17/279,623

(22) PCT Filed: Sep. 27, 2019

(86) PCT No.: PCT/EP2019/076286
§ 371 (c)(1),
(2) Date: Mar. 25, 2021

(87) PCT Pub. No.: WO2020/074285
PCT Pub. Date: Apr. 16, 2020

(65) Prior Publication Data
US 2021/0340690 A1    Nov. 4, 2021

(30) Foreign Application Priority Data

Oct. 12, 2018 (DE) ...................... 10 2018 217 509.8

(51) Int. Cl.
*C30B 15/14* (2006.01)
*C30B 15/26* (2006.01)

(52) U.S. Cl.
CPC .............. *C30B 15/14* (2013.01); *C30B 15/26* (2013.01)

(58) Field of Classification Search
CPC ................................. C30B 15/14; C30B 15/26
See application file for complete search history.

(56) References Cited

U.S. PATENT DOCUMENTS 5,919,303 A    7/1999   Holder
6,482,263 B1 * 11/2002  Ferry ...................... C30B 15/14
                                                          117/900

(Continued)

FOREIGN PATENT DOCUMENTS

EP       2031100 A1    3/2009
JP    2001039798 A    2/2001

(Continued)

*Primary Examiner* — Matthew J Song
(74) *Attorney, Agent, or Firm* — Leydig, Voit & Mayer, Ltd.

(57) ABSTRACT

An apparatus pulls a single crystal of semiconductor material by the Czochralski (CZ) method from a melt. The apparatus includes: a crucible that accommodates the melt; a resistance heater around the crucible; a camera system for observing a phase boundary between the melt and a growing single crystal, the camera system having an optical axis; a heat shield in frustoconical form with a narrowing diameter in a region at its lower end and arranged above the crucible and surrounding the growing single crystal; and an annular element, which is configured to capture particles, that projects inward from an inner side face of the heat shield and has an arrestor edge directed upward at an inner end of the annular element. The optical axis of the camera system runs between the arrestor edge and the growing single crystal. The annular element is releasably connected to the heat shield.

8 Claims, 3 Drawing Sheets

(56) References Cited

U.S. PATENT DOCUMENTS

2005/0257736 A1\* 11/2005 Shimosaka ............. C30B 29/06
                                                             117/208
2009/0229512 A1\* 9/2009 Kamogawa ............. C30B 35/00
                                                             117/217
2010/0319611 A1\* 12/2010 Orschel ................. G01B 11/08
                                                              117/15

FOREIGN PATENT DOCUMENTS

JP         2004352581  A     12/2004
JP         2017039628  A      2/2017

\* cited by examiner

DEVICE FOR PULLING A SINGLE CRYSTAL OF SEMICONDUCTOR MATERIAL OUT OF A MELT USING THE CZ METHOD, AND METHOD USING THE DEVICE

CROSS-REFERENCE TO PRIOR APPLICATIONS

This application is a U.S. National Phase Application under 35 U.S.C. § 371 of International Application No. PCT/EP2019/076286, filed on Sep. 27, 2019, and claims benefit to German Patent Application No. DE 10 2018 217 509.8, filed on Oct. 12, 2018. The International Application was published in German on Apr. 16, 2020 as WO 2020/074285 under PCT Article 21(2).

FIELD

The present invention provides an apparatus and for the use thereof for pulling of a single crystal of semiconductor material by the CZ (Czochralski) method from a melt.

BACKGROUND

EP 2 031 100 A1 describes an apparatus and a method of producing a single crystal by the CZ method.

U.S. Pat. No. 5,919,303 describes a method of recharging silicon, wherein the crucible is recharged with polycrystalline silicon in the form of granules.

JP2001-3978 A discloses a heat shield additionally having an inner cylinder to stop particles of silicon oxide (SiO) from falling into the melt. If such particles get into the growing single crystal, they can cause dislocations and make the single crystal unusable for the intended use. A disadvantage of this heat shield is that it hinders a clear view to the phase boundary between the melt and the growing single crystal.

SUMMARY

In an embodiment, the present invention provides an apparatus that pulls a single crystal of semiconductor material by the Czochralski (CZ) method from a melt. The apparatus includes: a crucible that accommodates the melt; a resistance heater around the crucible; a camera system for observing a phase boundary between the melt and a growing single crystal, the camera system having an optical axis; a heat shield in frustoconical form with a narrowing diameter in a region at its lower end and arranged above the crucible and surrounding the growing single crystal; and an annular element, which is configured to capture particles, that projects inward from an inner side face of the heat shield and has an arrestor edge directed upward at an inner end of the annular element. The optical axis of the camera system runs between the arrestor edge and the growing single crystal. The annular element is releasably connected to the heat shield.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
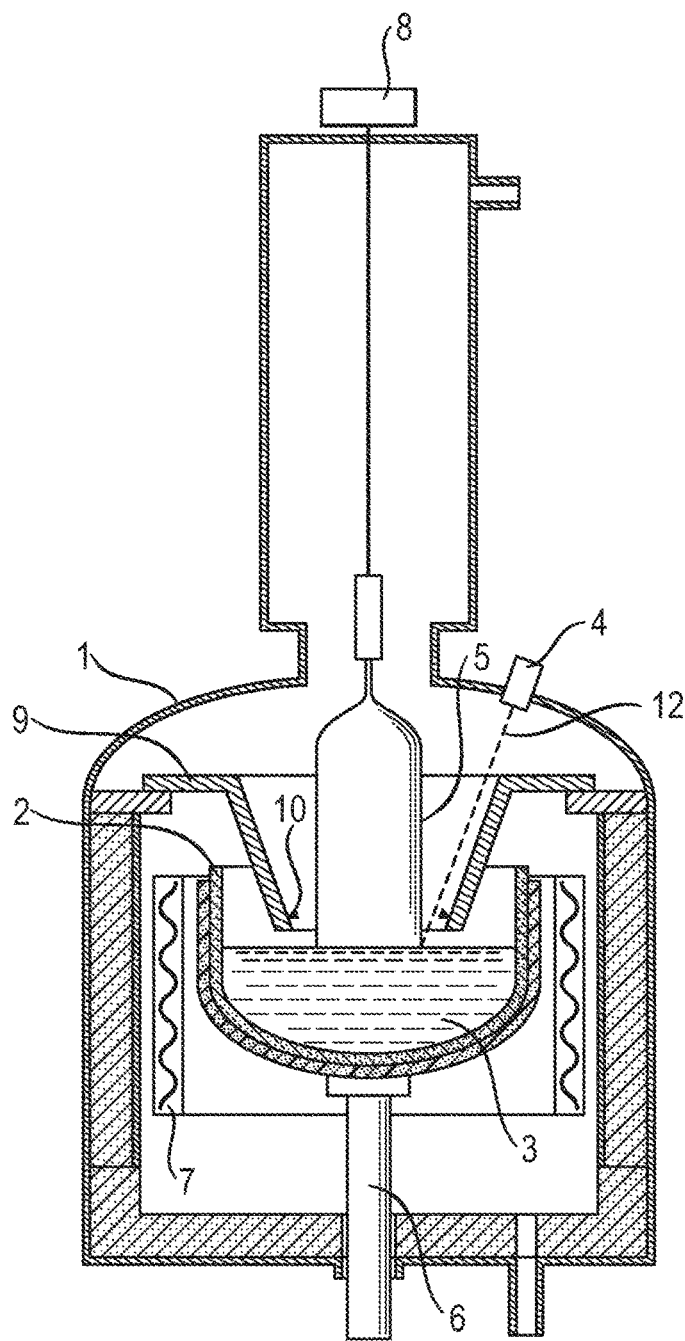
FIG. 1 and FIG. 3 each show an apparatus for pulling a single crystal of semiconductor material by the CZ method.

In an embodiment, the present invention provides an apparatus and a method of use thereof for pulling of a single crystal of semiconductor material by the CZ (Czochralski) method from a melt. The apparatus includes a crucible to accommodate the melt, a resistance heater arranged around the crucible, a camera system for observing a phase boundary between the melt and the growing single crystal, and a heat shield in frustoconical form with narrowing diameter in the region of its lower end and arranged above the crucible and surrounding the single crystal. Embodiments of the present invention can advantageously largely stop unwanted particles from getting into the melt, without any associated disadvantage.

An embodiment of the present invention provides an apparatus for pulling a single crystal of semiconductor material by the CZ method from a melt. The apparatus includes:

a crucible to accommodate the melt;
a resistance heater arranged around the crucible;
a camera system for observing a phase boundary between the melt and the growing single crystal, where the camera system has an optical axis; and
a heat shield in frustoconical form with narrowing diameter in the region of its lower end and arranged above the crucible and surrounding the growing single crystal.

In the embodiment, an annular element for capturing particles projects inward from an inner side face of the heat shield and has an arrestor edge directed upward at its inner end. The optical axis of the camera system runs between the arrestor edge and the growing single crystal.

Particles that can disrupt or terminate single-crystal growth of a crystal of semiconductor material form not only in the resubliming of SiO but especially also in the recharging of semiconductor material, especially in the form of abraded material that comes from the heat shield. The present invention ensures that dislocation events become less common and that the concentration of extraneous elements that originate from particles and are dissolved in the melt, especially the concentration of carbon, becomes lower.

The apparatus of the invention comprises a heat shield extended by an annular element that captures particles that, without its presence, would fall into the crucible. The annular element projects inward from an inner side face of the heat shield, i.e. in the direction of the growing single-crystal, and has a cross-sectional area having an arrestor edge (trapping enclosure) that projects upward at its inner end. Particles are captured between the arrestor edge and the heat shield. The annular element projects toward the growing single crystal, and the optical axis of the camera system runs between the arrestor edge and the growing single crystal. The optical axis does not meet either the heat shield or the annular element or its arrestor edge.

The heat shield is, entirely or at least in the region of its lower end, in frustoconical form with narrowing diameter.

In a preferred embodiment, the annular element is secured to the heat shield in such a way as to maintain a distance between the annular element and the lower end of the heat shield. This distance is preferably 10 mm to 100 mm.

In a preferred embodiment, the annular element is releasably connected to the heat shield. It preferably consists of the same material as the inner lateral face of the heat shield.

The arrestor edge projects from the inner end of the annular element upward, preferably over a distance of not less than 2 mm and not more than 100 mm. In addition, the arrestor edge is preferably inclined outward, i.e. inclined toward the heat shield.

An embodiment of the present invention also provides a method of pulling a single crystal of semiconductor material in an apparatus of an embodiment of the present invention. The method includes:

charging the crucible with solid semiconductor material;
melting a portion or the entire mass of the solid semiconductor material;
further charging the crucible with further solid semiconductor material;
heating the crucible contents until they have melted completely; and
pulling the single crystal by the CZ method.

The semiconductor material preferably consists of silicon, germanium or a mixture of the two elements.

The growing single crystal comprises a cylindrical section having a diameter of at least 200 mm, preferably at least 300 mm.

The features specified with regard to the above-detailed exemplary embodiments of the method of the invention can be applied correspondingly to the apparatus of the invention. Conversely, the features specified with regard to the above-detailed exemplary embodiments of the apparatus of the invention can be applied correspondingly to the method of the invention. These and other features of the embodiments of the invention are elucidated in the description of the figures and in the claims. The individual features can be implemented as embodiments of the invention either separately or in combination. In addition, they can describe advantageous executions that are independently protectable.

The apparatus according to FIG. 1 comprises a pulling chamber 1 in which there is situated a crucible 2 for accommodating the melt 3, and a camera system 4 for observing a phase boundary between the melt 3 and a growing single crystal 5. The crucible 2 is borne by a shaft 6 that can be raised, lowered and turned. Around the crucible 2 is arranged a resistance heater 7, with the aid of which solid semiconductor material is melted to form the melt 3. The single crystal 5 is pulled from the melt via a pulling mechanism 8. A heat shield 9 that surrounds the single crystal 5 is disposed above the crucible 2. The heat shield 9 is in frustoconical form with narrowing diameter in the region of its lower end. Between the growing single crystal 5 and the inner side face of the heat shield 9 there is an annular element 10 for capturing particles which is connected to the heat shield 9. The annular element 10 projects inward from the inner side face of the heat shield 9 (in the direction of the growing single crystal) and has, at its inner end, an arrestor edge 11 (FIG. 2) directed upward. The arrestor edge 11 is formed by a wall closed to form a tube. According to the invention, the annular element 10 and its arrestor edge 11 are formed such that they do not obstruct the optical axis 12 of the camera system 4, meaning that the optical axis 12 runs between the arrestor edge 11 and the growing single crystal 5.

Figure 3:
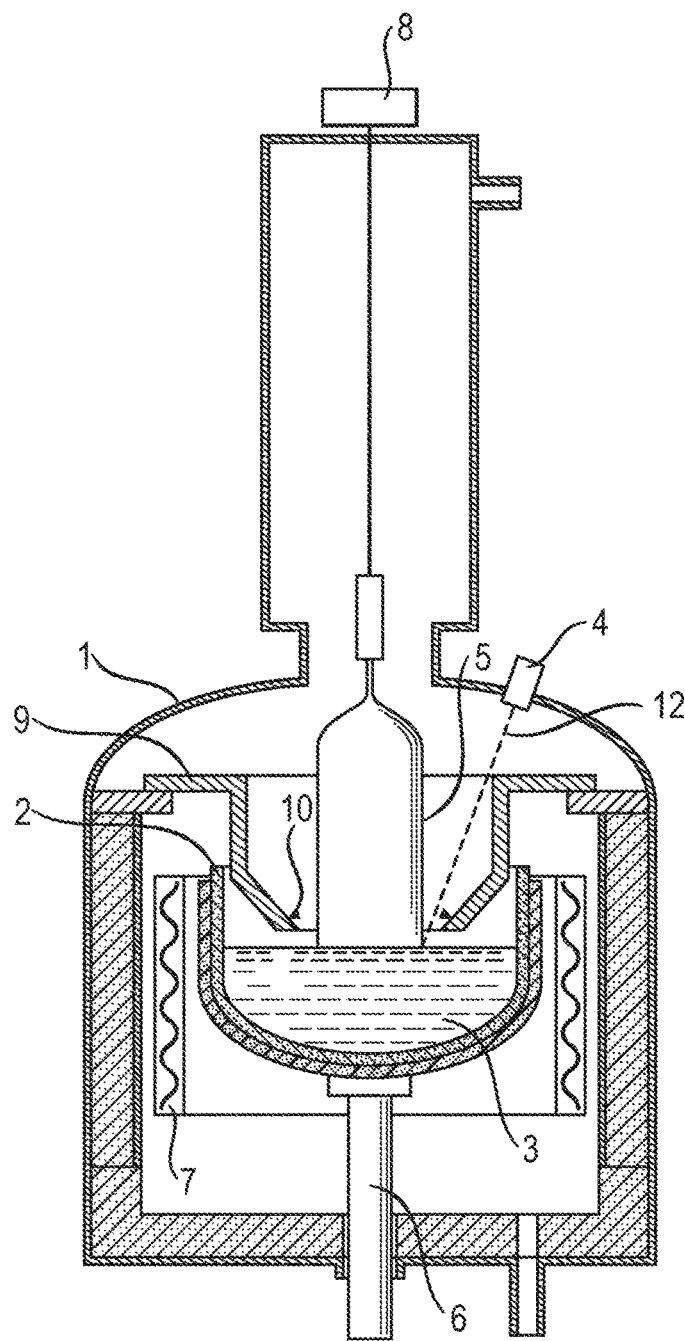

The apparatus according to FIG. 3, by contrast with the apparatus according to FIG. 1, comprises a heat shield 9 formed with narrowing diameter only in the region of its lower end. In the region above that it has a cylindrical shape.

Figure 2:
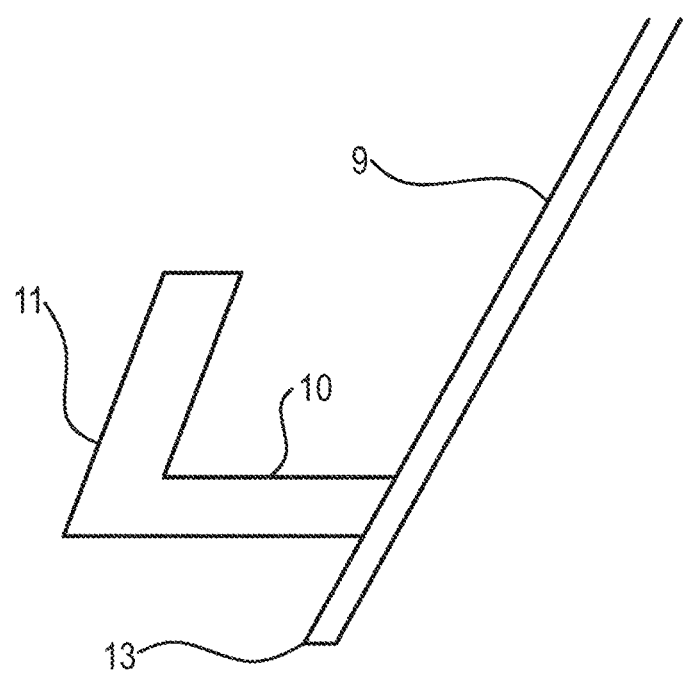
FIG. 2 shows a aspect of a heat shield connected to an annular element of the invention.

FIG. 2 shows a detail of the annular element 10 and of the heat shield 9 in cross section. In the embodiment shown, the annular element 10 has a certain distance from the lower end 13 of the heat shield 9 and the arrestor edge 11 is inclined toward the heat shield 9.

The above description of illustrative embodiments should be considered by way of example. The disclosure thus made firstly enables the person skilled in the art to comprehend the present invention and the associated advantages, and secondly, within the understanding of the person skilled in the art, also encompasses obvious alterations and modifications to the structures and methods described. Therefore, all such alterations and modifications and equivalents shall be covered by the scope of protection of the claims. For example, the apparatus may also comprise one or more coils that produce a magnetic field that acts on the melt.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An apparatus for pulling a single crystal of semiconductor material by the Czochralski (CZ) method from a melt, the apparatus comprising:
a crucible configured to accommodate the melt;
a resistance heater arranged around the crucible;
a camera system for observing a phase boundary between the melt and a growing single crystal, where the camera system has an optical axis;
a heat shield in frustoconical form with a narrowing diameter in a region of a lower end of the heat shield and arranged above the crucible and surrounding the growing single crystal; and
an annular element, which is configured to capture particles, that projects inward from an inner side face of the heat shield and has an arrestor edge directed upward at an inner end of the annular element, wherein the optical axis of the camera system runs between the arrestor edge and the growing single crystal, and wherein the annular element is releasably connected to the heat shield and consists of a same material as the inner side face of the heat shield.

2. The apparatus as claimed in claim 1, wherein the annular element is at a distance from the lower end of the heat shield.

3. The apparatus as claimed in claim 2, wherein the distance is 10 mm to 100 mm.

4. The apparatus as claimed in claim 1, wherein the arrestor edge is in an inclined arrangement relative to the heat shield.

5. A method of pulling a single crystal of semiconductor material in the apparatus as claimed in claim 1, the method comprising:

charging the crucible with solid semiconductor material;

melting a portion or an entire mass of the solid semiconductor material;

further charging the crucible with further solid semiconductor material;

heating the crucible contents until the crucible contents have melted completely; and pulling the single crystal by the CZ method.

6. The apparatus of claim 1, wherein the annular element is the only element that is configured to capture particles, projects inward from the inner side face of the heat shield, and has the arrestor edge directed upward.

7. The apparatus of claim 1, wherein the heatshield is uniform in shape around a central axis, wherein the annular element has a projecting element that projects inward from the inner side face of the heat shield orthogonal to the central axis, and wherein the arrestor edge is formed by a second projecting element that projects upward from an inner end of the projecting element and outward toward the inner side face of the heat shield.

8. The apparatus of claim 7, wherein a space for collecting the particles is defined on three sides by an inner face of the second projecting element, an upper face of the first projecting element, and the inner side face of the heat shield.

* * * * *